United States Patent [19]

Bonnefoy

[11] Patent Number: 4,611,869
[45] Date of Patent: Sep. 16, 1986

[54] CLAMPING DEVICE

[75] Inventor: Jean Bonnefoy, Crespieres, France

[73] Assignee: Compagnie Internationale pour l'Informatique Cii Honeywell Bull (Societe Anonyme), Paris, France

[21] Appl. No.: 326,818

[22] Filed: Dec. 2, 1981

[30] Foreign Application Priority Data

Dec. 5, 1980 [FR] France .................. 80 25858

[51] Int. Cl.⁴ ......................................... H01R 13/621
[52] U.S. Cl. .............................................. 339/75 MP
[58] Field of Search ............ 339/17 LM, 17 M, 75 M, 339/75 MP, 176 MK

[56] References Cited

U.S. PATENT DOCUMENTS

| | | | |
|---|---|---|---|
| 2,968,016 | 1/1961 | Angele | 339/75 MP |
| 3,314,040 | 4/1967 | McKee | 339/75 |
| 3,702,982 | 11/1972 | Kelly et al. | 339/176 MF |
| 3,942,854 | 3/1976 | Klein et al. | 339/75 MP |
| 4,057,311 | 11/1977 | Evans | 339/17 M |
| 4,130,327 | 12/1978 | Spaulding | 339/75 M |
| 4,194,800 | 3/1980 | Chow | 339/75 MP |
| 4,345,810 | 8/1982 | Bakermans | 339/75 MP |

FOREIGN PATENT DOCUMENTS

| | | |
|---|---|---|
| 0055640 | 7/1982 | European Pat. Off. . |
| 1251403 | 10/1967 | Fed. Rep. of Germany . |
| 1914398 | 10/1969 | Fed. Rep. of Germany . |
| 1192169 | 5/1970 | United Kingdom . |
| 1194539 | 6/1970 | United Kingdom ........ 339/176 MF |

OTHER PUBLICATIONS

IBM Bulletin, vol. 21, No. 1, 1978, "Packaging Structure", by Blake et al.
IBM Bulletin, vol. 17, No. 10, Mar. 1965, Essert, "Spring Pad for Etched-Circuit Electrical Connector".

Primary Examiner—Gil Weidenfeld
Assistant Examiner—Gary F. Paumen
Attorney, Agent, or Firm—Kerkam, Stowell, Kondracki & Clarke

[57] ABSTRACT

The invention relates to apparatus for clamping superimposed conductive elements (11, 13) disposed in aligned groups by means of a clip device (22, 23) such that an integrated circuit device may be removably connected to a printed circuit card with a predetermined force being applied uniformly across all the superimposed elements. In accordance with the invention, at least one of the clips (22, 23), in the free state, has a cambered form, equivalent to the elastic deformation of an initially straight beam of uniform section and of the same length mounted on two simple supports spaced this length and uniformly charged over this length.

The invention is primarily used for the electrical interconnection of integrated circuit devices to printed circuit cards.

17 Claims, 8 Drawing Figures

CLAMPING DEVICE

CROSS-REFERENCE TO RELATED APPLICATIONS

The subject matter of this invention is related to applications for patent, Ser. No. 326,820 of Gerard Dehaine and Ser. No. 326,530 of Jean Bonnefoy, all filed concurrently herewith and assigned to the assignee of the present invention. The subject matter of said applications are hereby incorporated by reference.

BACKGROUND OF THE INVENTION

1. Field of the Invention

The invention relates to a clamping device for clamping superimposed elements of aligned groups and relates more particularly to clamping of electrically superimposed conductor elements for interconnection of integrated circuit devices to printed circuit cards.

2. Description of the Prior Art

The clamping of two elements which may later have to be separated has the advantage of providing a convenient means of connection relatively adaptable to configurations of the elements and to the different clamping conditions, while leaving the elements practically unchanged, appropriate to any future utilization. Further, it is less costly and more efficient to clamp two elements than joining them by a solid connector such as solder.

The connection of elements by clamping is carried out throughout the electrical arts. A connection device which is well known for two superimposed conductive elements is the clamping wire or clamp cables found in the form of a shell associated with a clamping screw. Its utilization is, however, limited by the fact that for such clamps, it is necessary that there be as many clampwires as pairs of conductive elements to be connected.

The common collection of aligned groups of conductive elements may be made generally by two clips or straps which rectilinear clamp the groups of elements in the direction of their alignment. Two clamping members, notably a bolt, disposed at the respective extremities of the two clips while being spaced one from the other for a given length greater than that of the aligned groups, exercise on the extremities of the clips a predetermined clamping force. This connection device if simple and cheap, but it has the disadvantage of not exercising a uniform pressure on the spaced elements of each group. In effect, in adjusting the bolts mounted at the extremities of the two clips to apply the desired clamping force, the clips act as levers bearing on the elements of the extreme groups and flexing between them in accordance with the clamping force and the configuration of the clips. Such an arrangement is not useful for the uniform clamping of numerous aligned groups of superimposed elements even while employing thick and rigid clips.

In the area of electronics for example, the integration of endless crossing of circuits leads to the miniaturizing and the multiplication of the conductor elements for input and output of the electronic devices. For example, high density integrated circuit devices ordinarily have, at the present time, on the order of fifty output points, of 70 um width and spaced at 120 um about, while the substrates provided to receive these devices and the interconnector provided to receive these devices are provided, on each side, with 150 output points of 0.3 mm of width and spaced at about 0.5 mm. The points of the integrated circuit devices and of the substrates are in general associated with connecting conductors respectively and connected by them to the areas of connection disposed on the substrate for the connection of the integrated circuit devices and on printed circuit cards and for the interconnection of the substrates. It is necessary to exert an effort on the order of 100 grams per contact. In the case where a substrate has 150 points on a side of 75 mm, a force increasing to 1.5 kg must be exercised uniformly on this length.

In such circumstances, it is evident that the wire clamps are inapplicable and, on the other hand, it follows that the clamping device with clips mentioned above does not assure an efficient connection with the desired force of the elements of all the groups. It should also be noted that such a clamping device with clips is efficient only if the groups of elements are aligned in parallel to the clips. But, the deposit by serigraphie of an interconnection network of a substrate requires as many heatings of the substrate as there are conductive and insulating layers for the solidification of these layers. The successive heating and coolings result in distortion of the substrate and even more if the substrate has an elevated surface. It follows that the straight and rigid clips would be disadvantageous and less desirable as the substrate surface increases and the interconnection network and points of input and output become more dense.

On the other hand, soldering of connecting conductors as fine and as close as those defined above has the disadvantage of requiring a very delicate operation, particularly in the replacement of an integrated circuit device on a substrate or of a substrate on a card. In this case, it is necessary in effect to resolder all of the connecting conductors without deforming them, while maintaining them equally spaced leaving them undamaged, as well as the areas to which they were soldered. In view of their reutilization, it is necessary then to resolder without there being any alteration of the quality of the solder and the adjacent elements (caused notably by the heat discharge and propagated by the conductors, the points or the areas) and creation of short circuits due to lapping solders.

The immovability of the connection device of the conductor elements (points, connecting contacts, areas) present in the preceding example is thus an important factor. The high density integrated circuit devices are actually relatively costly products, and the interconnection substrates are also very costly. Accordingly, their replacement in view of their repair and reutilization is desirable. It can be seen that clamping is apt to allow replacement, but traditional clamping arrangements using rigid and rectilinear clips are unsuitable for this purpose.

SUMMARY OF THE INVENTION

The present invention overcomes the disadvantages of prior art clamping devices.

A device in accordance with the present invention for clamping superimposed elements of groups arranged along a given line is of the type comprising two clamping means arranged for clamping the said groups and two force adjusting means for the said clamping means disposed at their respective extremities and being spaced one from the other by a given length and exercising on them a clamping force which has been predetermined and is characterized in that at least one of the said clamping means has in its free state, not constrained, a cambered form relative to the said line, equivalent to the elastic deformation of a beam having initially the form of the said line, of uniform section and resting on two simple supports spaced the said length and uniformly subjected on this length with a total value corresponding substantially to double that of the said clamping force applied to each extremity of the clip, so that the deformation of the clamping means caused by the said force adjusting means takes the form of the said line and produces a uniform clamping of the elements of each group.

BRIEF DESCRIPTION OF THE DRAWINGS

The characteristics and advantages of the invention will appear more clearly in the description which follows with reference to the accompanying drawings.

DESCRIPTION OF THE PREFERRED EMBODIMENTS

The example serving to illustrate the structure and the advantages of a clamping device conforming to the invention will be described in connection with connecting leads of an interconnection substrate supporting integrated circuit devices to a printed circuit card, it being understood that the inconveniences of the prior art clamping devices have been discussed above with respect to such a connection. This example will illustrate the principal advantages of the invention.

Figure 1:
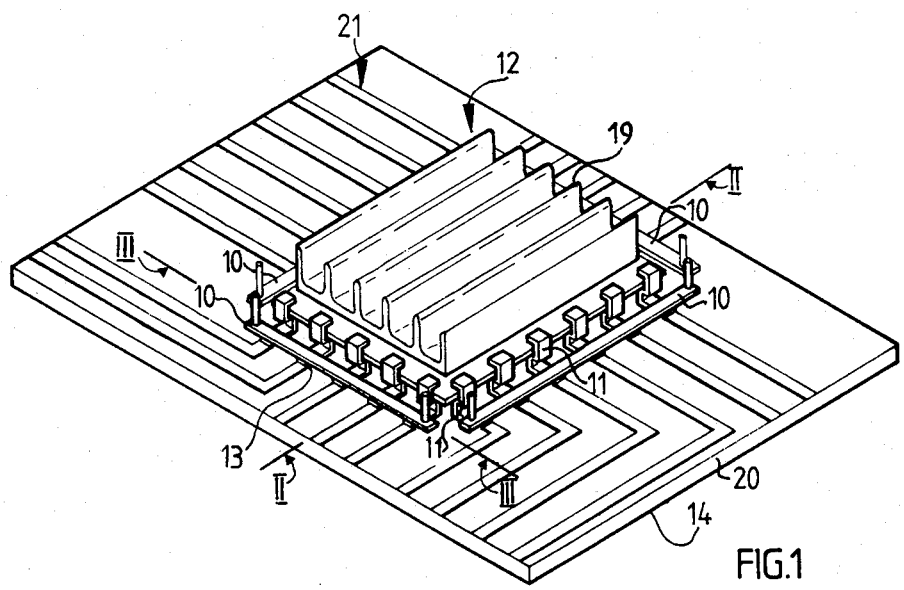
FIG. 1 is a schematic view from above and in perspective of an interconnection substrate for integrated circuit devices connected to a printed circuit card by means of clamping devices conforming to the invention.
Figure 2:
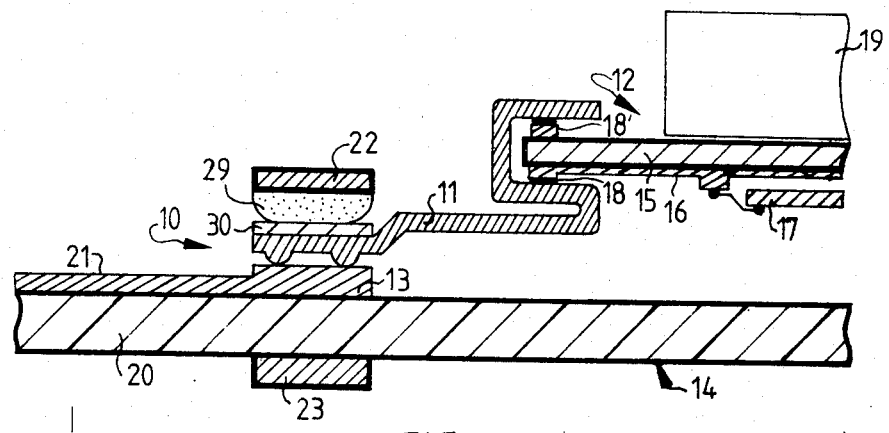
FIG. 2 is an enlarged fragmentary view in section along the line II—II of FIG. 1.

FIG. 1 illustrates in perspective an embodiment conforming to the invention with four identical clamping devices (10) connecting, as will be better seen in FIG. 2, the connecting leads (11) of a substrate (12) with areas of connection or contact pads (13) disposed on a printed circuit card (14) (illustrated in FIG. 1 in partial form) serving to interconnect the substrate (12) between circuit connections on the card as well as to the input and output connections of the card, not shown.

Substrate (12), fragmentarily shown in FIGS. 1 and 2 comprises a support plate (15), of which one face has an interconnection network (16) in the form of printed circuits, connecting integrated circuit devices (17) between them as well as the input and ouput contacts (18), and of which the other face comprises a finned radiator (19) for the thermal dissipation of heat created in the integrated circuit devices (17). The connecting leads (11) are soldered at one of their extremities to the contacts (18) as well as the corresponding contacts (18') insulated electrically on the other face of the support plate (15).

The printed circuit card (14) comprises a support plate (20) provided with an interconnection network (21) in the form of printed circuits, comprising areas of connection or contact pads (13).

Figure 3:
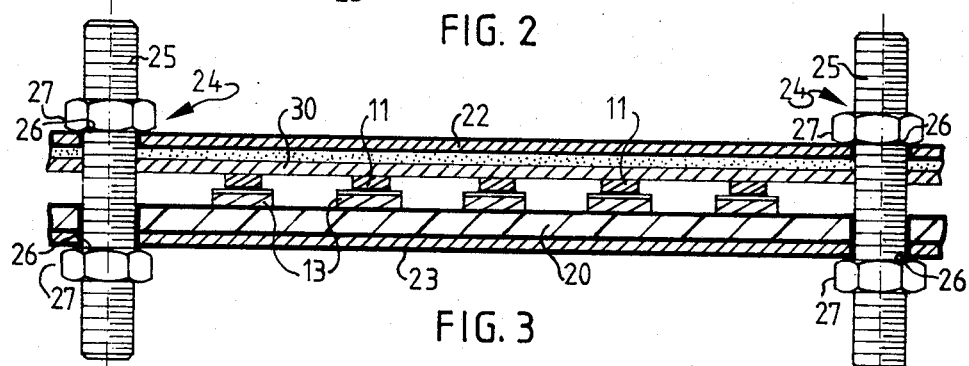
FIG. 3 is a fragmentary cross-sectional view on the line III—III of FIG. 1, illustrating in detail a clamping device conforming to the invention in the clamping state.

FIGS. 2 and 3 illustrate in great detail an embodiment of the clamping device (10) conforming to the invention, respectively in transverse section and in longitudinal section. The clamping of the connectors (11) against the areas (13) is made by means of device (10) comprising two clamping means in the form of clips (22, 23) provided with force adjusting means (24) for the clips, disposed at their respective extremities and being spaced one from the other by a given length and exercising on them a predetermined clamping force. In the example illustrated, the force means (24) comprises threaded bolts (25) passing through the extremities of the clips (22) and (23) through openings (26) and being provided with nuts (27) which exert on the extremities of the clips a predetermined clamping force.

Figure 6A:
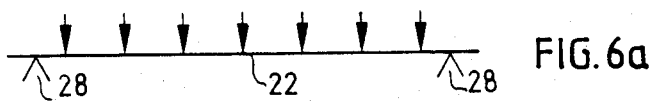
FIGS. 6a and 6b are schematics illustrating the deformed elastic equivalent of a clamping clip conforming to the invention and FIG. 7 is a perspective view of a variant of the embodiment of a device conforming to the invention for replacing the four clamping devices shown in FIG. 1.
Figure 6B:
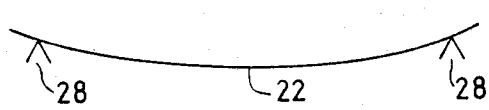
Figure 4:
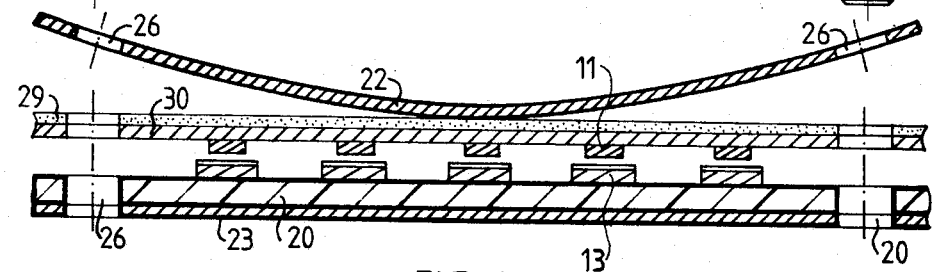
FIG. 4 is a view similar to that of FIG. 3 illustrating the embodiment of a device conforming to the invention in the non-clamping state.

FIG. 4 illustrates the essential characteristic of the invention which is found in the fact that one of the clips (22) has a cambered form relative to the line formed by the group of elements (11) and (13), this line being straight in the example illustrated. As shown schematically in FIGS. 6a and 6b, the cambered form of clip (22) is equivalent to the elastic deformation of a beam having initially the form of the line formed by the elements (straight line of the example illustrated) of uniform section and mounted on two supports (28) separated substantially the same length separating the force means (24) and uniformly burdened on this length with a total value corresponding substantially to double that of the clamping force applied to each extremity of the clip by the bolts (25). The shape of the curve taken by the clip (22) corresponds thus to a catenary curve. Deformation of clip (22) exercised by the force means (24) finally to give it the rectilinear form of alignment of the elements (11) and (13) provides a uniform clamping of all the elements (11, 13) of each pair between the clips.

In FIG. 4, clip (23) takes the form of alignment of the elements (11 and 13). In this regard, it is not there only to serve as reaction surface of bearing sufficient to exert the predetermined clamping force. Consequently, in the case where the support plate (20) of card (14) has a sufficient rigidity to be able to support without damage the clamping force, this plate (20) can take the place of clip (23), which then need not be used.

Figure 5:
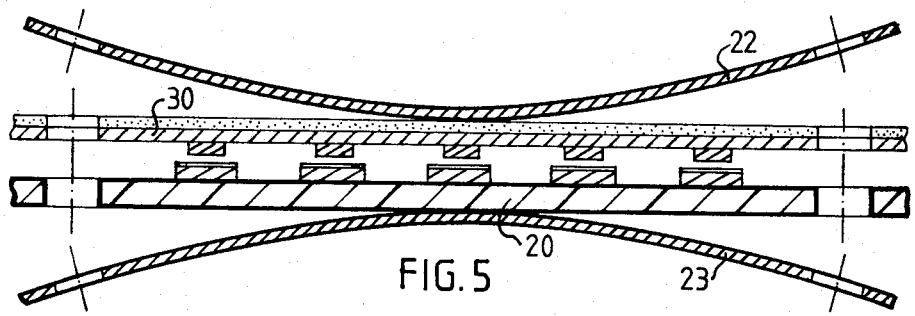
FIG. 5 is a view analogous to that of FIGS. 3 and 4 illustrating a variant of the embodiment of a device conforming to the invention in the non-clamping state.

On the other hand, the two clips (22 and 23) can take the same cambered form as that of clip (22) shown in FIG. 4, as is illustrated in FIG. 5. This gives the assurance of having a uniform clamping pressure due to the concomitant action of the deformation of the clips (22) and (23). Actually, in the device shown in FIG. 4, clip (23) can undergo forces tending to curve it, with a result that a uniform clamping action produced by clip (22) can be altered in certain areas because of the disengagement of the surface of bearing reaction formed by plate (20) and the clip (23).

As shown in FIGS. 2 to 5, a supple joint (29) can be interposed between the clip (22) and a series of elements, such as the contacts (11) in the example illustrated. This supple joint permits absorption of the forces due to the fact that the line of the groups of elements (11) and (13) cannot be perfectly straight, that the thickness of the elements (11) and (13) of a same group can vary from groups to others, primarily. In other words, the joint (29) advantageously distributes the clamping force on the assembly of the groups of elements (11) and (13).

Further, being given that the connectors are very thin elements and very fragile, but will be to advantage to maintain their desired spacing by means of a rigid band (30), fixed to elements (11) corresponding.

Figure 7:
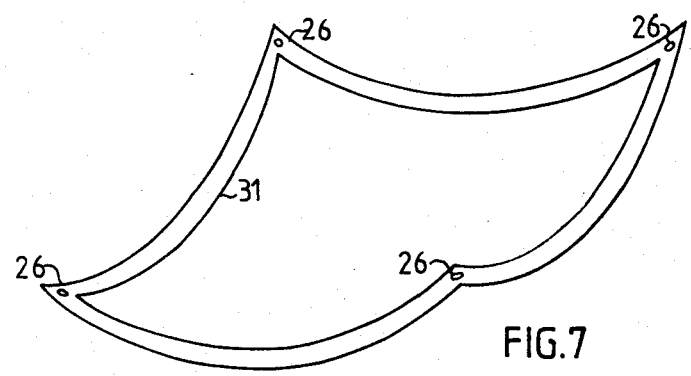

As seen in FIG. 7, the assembly of the four clips (22) or of the four clips (23) of the clamping devices (10) seen in FIG. 1, can be formed of a single piece (31). More generally when the substrate (12) is provided with contacts on adjacent sides, the corresponding clips can be formed of a single piece. In the case where the force means (24) are formed by threaded bolts, piece (31) can be provided with corresponding orifices (26). It should be understood, the means for fixation (24) can be formed by other means, such as for example clamps, etc.

It follows from the above description that a clamping device conforming to the invention can be adapted to the connection between whatever elements disposed in groups following a line of any form, the principles of cambering of one of the clips at least remaining the same and the resulting effects of the deformation equally.

It is to be noted also that the same device (10) or (31) can be applied to the connection of connectors of integrated circuit devices (17) of large dimensions to the support plane (15) of substrate (12).

I claim:

1. Clamping apparatus for uniformly exerting a predetermined force on superimposed elements of first and second groups of elements, the elements of each group being arranged to extend along a line, the apparatus comprising first and second clamping means for clamping the superimposed elements of said groups therebetween, and two force adjusting means disposed at the extremities of the clamping means, the two force adjusting means being spaced by a predetermined length and adapated to exert on the clamping means at each extremity thereof a preselected clamping force, said first clamping means possessing, in an unclamped, unconstrained state, a cambered shape with respect to the line along which the elements extend, said cambered shape being equivalent to the elastic deformation shape assumed by a beam of uniform cross-section having initially a shape corresponding to the shape of said line and mounted on two supports spaced said predetermined length upon the beam being uniformly loaded along this length by a total force corresponding substantially to double that of the said clamping force applied to each extremity, so that the deformation of the first clamping means in response to the clamping force of said force adjusting means causes said first clamping means to assume the shape corresponding to said line and to exert uniformly said predetermined force on each of the elements of each group to clamp said elements together.

2. Apparatus for clamping in accordance with claim 1 further including a flexible joint interposed between at least one of the clamping means and the elements of an associated one of said groups.

3. Apparatus for clamping in accordance with claim 1 including a rigid band fixed to the elements of each group to maintain a desired spacing between the associated elements of each group when the clamping force is applied by the force adjusting means.

4. Apparatus in accordance with claims 1, 2 or 3 wherein the elements of the first group comprise conductors of a first printed circuit plate of an electronic arrangement, and the elements of the second group comprise conductors on a second printed circuit plate.

5. Apparatus in accordance with claim 4 wherein one of the said clamping means is constituted by one of the said printed circuit plates.

6. Apparatus in accordance with claim 5 wherein the conductors on the first plate are disposed along a first side thereof and said first plate further includes other conductors disposed along an adjacent second side thereof, and said first clamping means comprises a member having a shape that conforms to the configuration of the adjacent sides of the first plate.

7. Apparatus as set forth in claim 1 wherein said first clamping means, when not restrained, has a cambered shape corresponding to a catenary curve.

8. Apparatus for clamping in accordance with claim 2 including a rigid band fixed to the elements of each group to maintain a desired spacing between the associated elements of each group when the clamping force is applied by the force adjusting means.

9. Apparatus according to claim 1, wherein said first and second clamping means are similarly cambered but in opposite directions.

10. Clamping apparatus for uniformly exerting a predetermined force on a plurality of first electrical terminals disposed in side-by-side relationship along a line in order to clamp the terminals in contact with corresponding second terminals disposed on terminal support means, the apparatus comprising an elongated clamp member adapted to be located on an upper side of the first terminals, and first and second force adjusting means disposed at the extremities of the clamp member and connected to the terminal support means for exerting on the clamp member at each extremity a preselected clamping force to clamp the first terminals to the second terminals, the clamp member having, in an unclamped state, a cambered shape such that, upon said preselected clamping force being applied to the extremities of the clamp member, the clamp member deforms to assume the shape of said line and uniformly exerts throughout its length said predetermined force on each of the first terminals to clamp the first terminals to the second terminals.

11. Apparatus according to claim 10, wherein said cambered shape corresponds to the shape a beam of uniform cross-section supported at points spaced by the distance between the extremities of the clamp member at which the preselected clamping force is applied assumes due to elastic deformation of the beam upon the beam being uniformly loaded along its length between said support points with a total force corresponding substantially to double the clamping force applied at each extremity of the clamp member.

12. Apparatus according to claim 10, wherein said cambered shape corresponds to a catenary curve.

13. Apparatus according to claim 10 further comprising another elongated clamp member disposed on an opposite side of the terminal support means from said second terminals and connected to the first-mentioned clamp member by said force adjusting means, the force adjusting means applying said preselected clamping force to the extremities of said other clamp member and the other clamp member being cambered with respect to the terminal support means when in an unclamped state such that, upon said preselected clamping force being applied, the other clamp member uniformly exerts throughout its length said predetermined force on the terminal support means.

14. Apparatus according to claim 10 further comprising a supple member interposed between the clamp member and the first terminals.

15. Apparatus according to claim 10 further comprising a rigid member connected to the first terminals to maintain a desired spacing therebetween when the clamping force is applied to the clamp member.

16. Apparatus according to claim 10, wherein said first terminals comprise the terminals of an integrated circuit chip, and wherein said terminal support means comprises a printed circuit plate upon which said second terminals are disposed.

17. Apparatus according to claim 16, wherein said first terminals are disposed along adjacent sides of the integrated circuit chip, and the clamp member is shaped so as to conform to the configuration of said adjacent sides.

* * * * *

UNITED STATES PATENT AND TRADEMARK OFFICE
CERTIFICATE OF CORRECTION

PATENT NO. : 4,611,869

DATED : September 16, 1986

INVENTOR(S) : Bonnefoy

It is certified that error appears in the above-identified patent and that said Letters Patent is hereby corrected as shown below:

Column 6, line 14 (claim 7) "restained" should be --restrained--.

Signed and Sealed this

Thirteenth Day of January, 1987

Attest:

DONALD J. QUIGG

Attesting Officer

Commissioner of Patents and Trademarks